(12) United States Patent
Pei et al.

(10) Patent No.: US 10,251,301 B2
(45) Date of Patent: Apr. 2, 2019

(54) CABLE MANAGEMENT DEVICE

(71) Applicant: Aver Information Inc., New Taipei (TW)

(72) Inventors: Chien-Chang Pei, New Taipei (TW); Yi-Cheng Chien, New Taipei (TW); Hui-Lun Hung, New Taipei (TW)

(73) Assignee: AVER INFORMATION INC., New Taipei (TW)

( * ) Notice: Subject to any disclaimer, the term of this patent is extended or adjusted under 35 U.S.C. 154(b) by 0 days.

(21) Appl. No.: 15/974,920

(22) Filed: May 9, 2018

(65) Prior Publication Data

US 2019/0069435 A1 Feb. 28, 2019

(30) Foreign Application Priority Data

Aug. 23, 2017 (TW) .............................. 106128525 A

(51) Int. Cl.
*H02B 1/20* (2006.01)
*H05K 7/14* (2006.01)

(52) U.S. Cl.
CPC .................................. *H05K 7/1491* (2013.01)

(58) Field of Classification Search
CPC .................................................... H05K 7/1491

USPC ........................................................... 361/826
See application file for complete search history.

(56) References Cited

U.S. PATENT DOCUMENTS

| | | | |
|---|---|---|---|
| 6,621,714 B1 * | 9/2003 | Li .............................. | F16L 3/23 174/191 |
| 7,755,906 B2 * | 7/2010 | Sato .................... | G03G 21/1652 361/730 |
| 8,240,629 B2 * | 8/2012 | Spiess ....................... | F16B 2/22 24/459 |

* cited by examiner

*Primary Examiner* — Hung S. Bui
(74) *Attorney, Agent, or Firm* — McClure, Qualey & Rodack, LLP

(57) ABSTRACT

A cable management device includes a wiring body, having a first sidewall, a second sidewall and a groove rail, wherein the groove rail is formed between the first and second sidewalls and has a input end, a output end, and a corner between the input end and the output end. A first resisting element extends from one side of the first sidewall of the wiring body. A first elastic connecting element includes a first connecting part and a first elastic arm, wherein the first connecting part is connected between the wiring body and the first elastic arm. A second resisting element extends from one side of the second sidewall of the wiring body. A second elastic connecting element has a second connecting part and a second elastic arm, wherein the second connecting part is connected between the wiring body and the second elastic arm.

9 Claims, 5 Drawing Sheets

CABLE MANAGEMENT DEVICE

REFERENCE TO RELATED APPLICATIONS

This Non-provisional application claims priority under 35 U.S.C. § 119(a) on Patent Application No. 106128525 filed in Taiwan on Aug. 23, 2017, the entire contents of which are hereby incorporated by reference.

BACKGROUND

1. Technical Field

The present invention relates to a cable management device, particularly to a cable management device utilizing clipping or locking.

2. Description of Related Art

As progressing of electronic technology, various types of wires such as telephone lines, power lines, electrical lines for electric appliances and RJ-45 lines for LAN are popular in daily life. Usually, the above wires are flexible with different lengths and diameters, and thus difficult for users to deal with.

In a well-known method for arranging and securing wires, wires are tied by zip ties so as to be in a cleaner manner. However, in case that wires have to be replaced correspondingly when replacing electronic devices, the user has to cut the zip ties and re-arrange the wires, which is time-consuming and will cause damage to environment.

On the other hand, in another well-known method for arranging and securing wires, the fixing element can merely suit for a single diameter of wire. To be capable of dealing with types of wires with different diameters, the fixing element may usually enlarge its size. Hence, when arranging wires with smaller diameter, the wires may be loosed and slide because such a fixing element cannot hold them tight. Accordingly, such a fixing element may fail to make its desired function.

It is therefore desirable to provide a cable management device, which can suit for wires of different diameters and can be easily removed and replaced.

SUMMARY OF THE INVENTION

It is therefore an object of the present invention to provide a cable management device, which can suit for wires of different diameters and can be easily removed and replaced.

To achieve the above, the present invention is to provide a cable management device, being cooperated with a fixing element having a resisting plate with an opening formed thereon, the cable management device comprises a wiring body, having a first sidewall, a second sidewall and a groove rail, the first sidewall being disposed opposite to the second sidewall, the groove rail being formed between the first and second sidewalls and having a input end and a output end at both ends and at least one corner between the input end and the output end; a first resisting element, being in the form of a plate and having a first resisting surface, extending from one side of the first sidewall of the wiring body; a first elastic connecting element, including a first connecting part and a first elastic arm, a first end of the first connecting part being connected to the wiring body, the first elastic arm being connected to a second end of the first connecting part and extending toward the first resisting element; a second resisting element, being in the form of a plate and having a second resisting surface, extending from one side of the second sidewall of the wiring body; and a second elastic connecting element, including a second connecting part and a second elastic arm, a third end of the second connecting part being connected to the wiring body, the second elastic arm being connected to a fourth end of the second connecting part and extending toward the second resisting element; wherein the wiring body, a portion of the first resisting element and a portion of the second resisting element are adapted to pass through the opening of the fixing element, and wherein the first resisting surface and the second resisting surface are adapted to contact the resisting plate of the fixing element.

In one embodiment of the present invention, the first elastic arm of the first elastic connecting element passes through a first opening of the first resisting element, and the second elastic arm of the second elastic connecting element passes through a second opening of the second resisting element.

In one embodiment of the present invention, the cable management device further comprises a first clipping element, being formed on the first elastic arm between the first connecting part and the first opening; and a second clipping element, being formed on the second elastic arm between the second connecting part and the second opening.

In one embodiment of the present invention, the first clipping element has a first penetrating part and a first assistant resisting part connected to each other, the surface of the first penetrating part has a first slope with respect to the surface of the first elastic arm, the surface of the first assistant resisting part has a second slope with respect to the surface of the first elastic arm, the first slope is smaller than the second slope.

In one embodiment of the present invention, a distance between the first assistant resisting part and the first resisting surface is equal to a thickness of the fixing element.

In one embodiment of the present invention, the second clipping element has a second penetrating part and a second assistant resisting part connected to each other, the surface of the second penetrating part has a third slope with respect to the surface of the second elastic arm, the surface of the second assistant resisting part has a fourth slope with respect to the surface of the second elastic arm, the third slope is smaller than the fourth slope.

In one embodiment of the present invention, a distance between the second assistant resisting part and the second resisting surface is equal to a thickness of the fixing element.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

Reference will now be made to the drawings to describe various inventive embodiments of the present disclosure in detail, wherein like numerals refer to like elements throughout.

Figure 1:
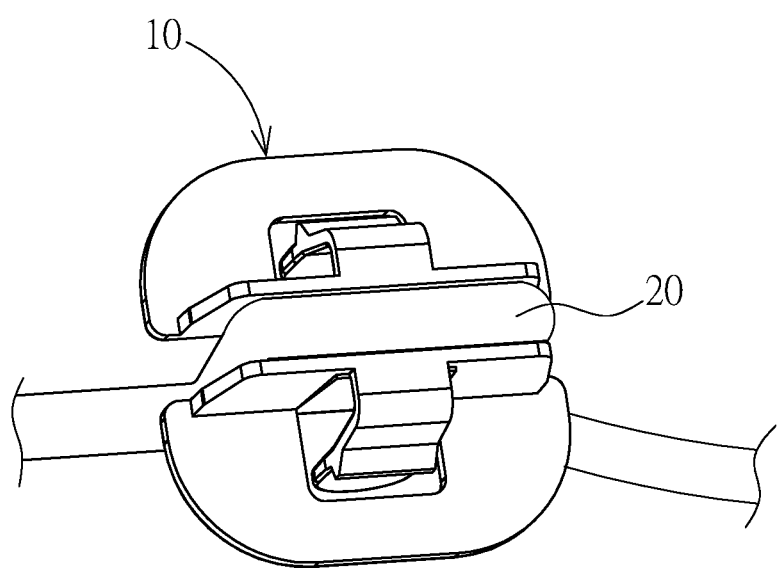
FIG. 1 is a schematic diagram of a cable management device 10 for securing a wire 20 according to a preferred embodiment of the present invention.

FIG. 1 is a schematic diagram of a cable management device 10 for securing a wire 20 according to a preferred embodiment of the present invention. Refer to FIG. 1, the cable management device 10 may serve to secure the wire 20. The wire 20 may include any kinds of analogues with similar terminologies, such as "cable", "line" and "cord", etc. For example, the wire 20 may include but is not limited to a power line of an electric appliance, a transmission line of an electronic device, a RJ-45 line for LAN and a signal line, etc. Furthermore, the aforesaid wires, cables, lines or cords may have different sizes of wire diameters.

Figure 2:
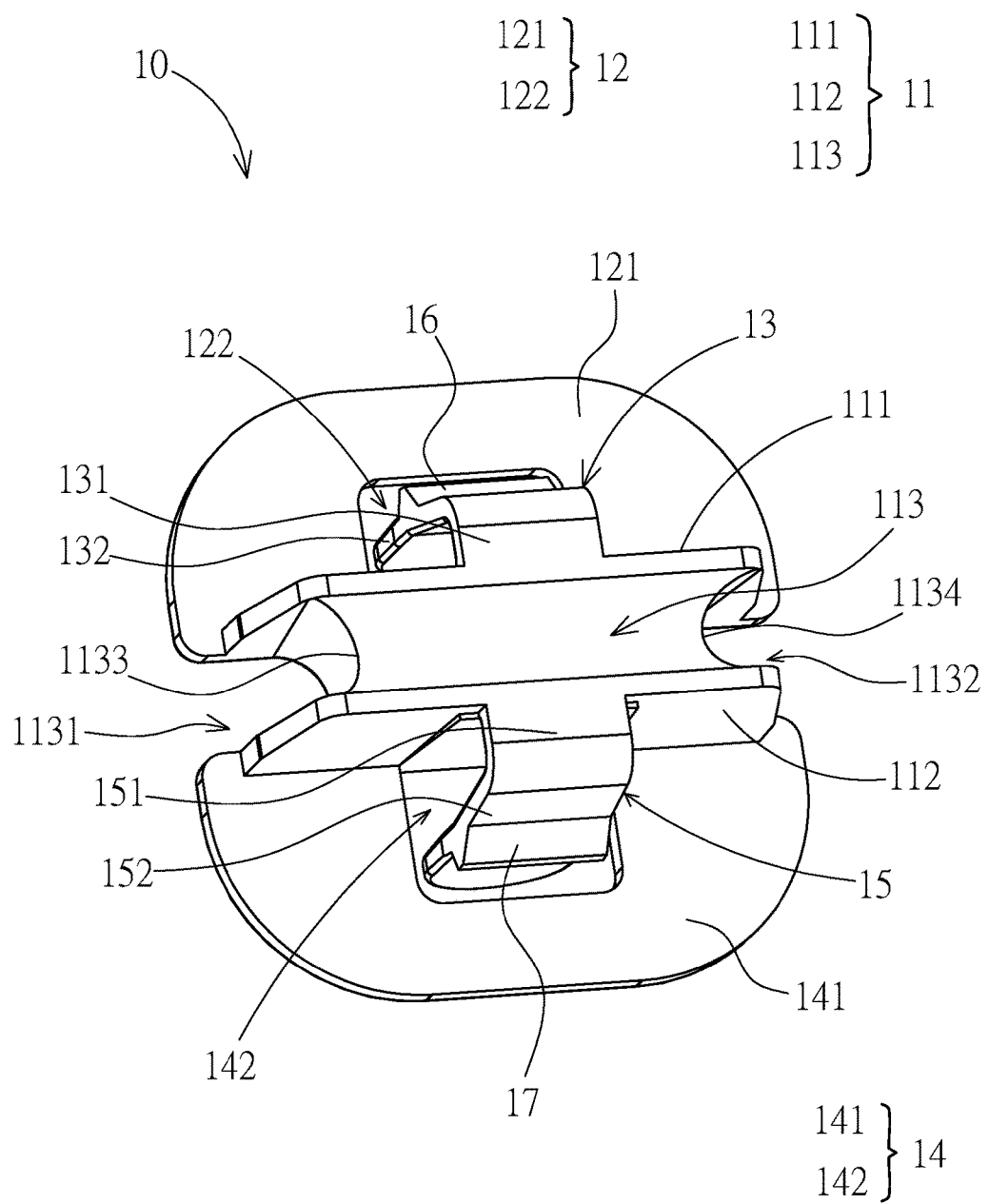
FIG. 2 is a schematic diagram of the cable management device 10 according to the preferred embodiment of the present invention.
Figure 3:
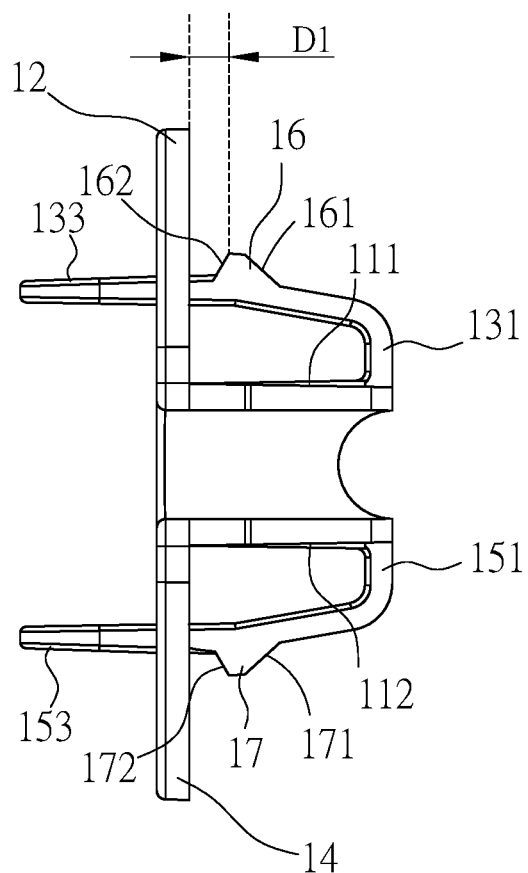
FIG. 3 is a side view of the cable management device 10 as illustrated in FIG. 2 according to the preferred embodiment of the present invention.

FIG. 2 is a schematic diagram of the cable management device 10 according to the preferred embodiment of the present invention, and FIG. 3 is a side view of the cable management device 10 as illustrated in FIG. 2 according to the preferred embodiment of the present invention. Refer to FIG. 2 and FIG. 3, the cable management device 10 may include a wiring body 11, a first resisting element 12, a first elastic connecting element 13, a second resisting element 14, a second elastic connecting element 15, a first clipping element 16 and a second clipping element 17. The cable management device 10 may be disposed on a surface having an opening (or a through hole) so that the above wire 20 may be secured to the opening.

Specifically, the wiring body 11 may have a first sidewall 111, a second sidewall 112 and a groove rail 113. The first sidewall 111 may be disposed opposite to the second sidewall 112, and the groove rail 113 may be formed between the first and second sidewalls 111 and 112. Furthermore, the groove rail 113 may have an input end 1131 and an output end 1132. The wire 20 (not shown in FIG. 2) may be disposed along the groove rail 113 leaving two ends of the wire 20 exposed out of the input and output ends 1131 and 1132 respectively. Moreover, the groove rail 113 may have a first corner 1133 and a second corner 1134 formed between the input and output ends 1131 and 1132. In other words, the wire 20, which is disposed along the groove rail 113, may further pass the input end 1131, the first corner 1133, the second corner 1134 and the output end 1132 by order and thus be secured to the wiring body 11.

The first resisting element 12 may be in the form of a plate, and may have a first resisting surface 121 with a first opening 122. The first resisting element 12 may extend from one side of the first sidewall 111 of the wiring body 11. Furthermore, the first opening 122 may be formed on the first resisting surface 121 adjacent to the first sidewall 111. In this embodiment, the first sidewall 111 may be approximately perpendicular to the first resisting surface 121.

The first elastic connecting element 13 may have a first connecting part 131 and a first elastic arm 132. A first end of the first connecting part 131 may be connected to the wiring body 11. In addition, the first elastic arm 132 may be connected to a second end of the first connecting part 131 and extend toward the first resisting element 12. The first elastic arm 132 may further pass through the first opening 122 of the first resisting element 12. More particularly, the first elastic arm 132 may have a first releasing part 133, which is the portion of the first elastic arm 132 that passes through the first opening 122. A plurality of first protrusions (not shown in FIGS. 2 and 3) may be arranged on the surface of the first releasing part 133. Accordingly, by applying force on the first releasing part 133, the first elastic arm 132 may bend with the first connecting element 131 as a pivot.

Likewise, the second resisting element 14 may be in the form of a plate, and may have a second resisting surface 141 with a second opening 142. The second resisting element 14 may extend from one side of the second sidewall 112 of the wiring body 11. Furthermore, the second opening 142 may be formed on the second resisting surface 141 adjacent to the second sidewall 112. In this embodiment, the second sidewall 112 may be approximately perpendicular to the second resisting surface 141. Moreover, the first and second resisting surfaces 121 and 141 may substantially extend along a same plane. As a result, the first and second resisting surfaces 121 and 141 may both contact a surface on which the cable management device 10 is disposed.

Likewise, the second elastic connecting element 15 may have a second connecting part 151 and a second elastic arm 152. A third end of the second connecting part 151 may be connected to the wiring body 11. In addition, the second elastic arm 152 may be connected to a fourth end of the second connecting part 151 and extend toward the second resisting element 14. The second elastic arm 152 may further pass through the second opening 142 of the second resisting element 14. More particularly, the second elastic arm 152 may have a second releasing part 153, which is the portion of the second elastic arm 152 that passes through the second opening 142. A plurality of second protrusions (not shown in FIGS. 2 and 3) may be arranged on the surface of the second releasing part 153. Accordingly, by applying force on the second releasing part 153, the second elastic arm 152 may bend with the second connecting element 151 as a pivot.

The first clipping element 16 may be formed on the first elastic arm 132 and located between the first connecting part 131 and the first opening 122 of the first resisting element 12. Furthermore, the first clipping element 16 may have a first penetrating part 161 and a first assistant resisting part 162 which are connected to each other. The surface of the first penetrating part 161 may have a first slope with respect to the surface of the first elastic arm 132. On the other hand, the surface of the first assistant resisting part 162 may have a second slope with respect to the surface of the first elastic arm 132. Particularly, the first slope may be smaller than the second slope. That is, the first penetrating part 161 may be flatter than the first assistant resisting part 162.

The second clipping element 17 may be formed on the second elastic arm 152 and located between the second connecting part 151 and the second opening 142 of the second resisting element 14. Furthermore, the second clipping element 17 may have a second penetrating part 171 and a second assistant resisting part 172 which are connected to each other. The surface of the second penetrating part 171 may have a third slope with respect to the surface of the second elastic arm 152. On the other hand, the surface of the second assistant resisting part 172 may have a fourth slope with respect to the surface of the second elastic arm 152. Particularly, the third slope may be smaller than the fourth slope. That is, the second penetrating part 171 may be flatter than the second assistant resisting part 172.

Figure 4:
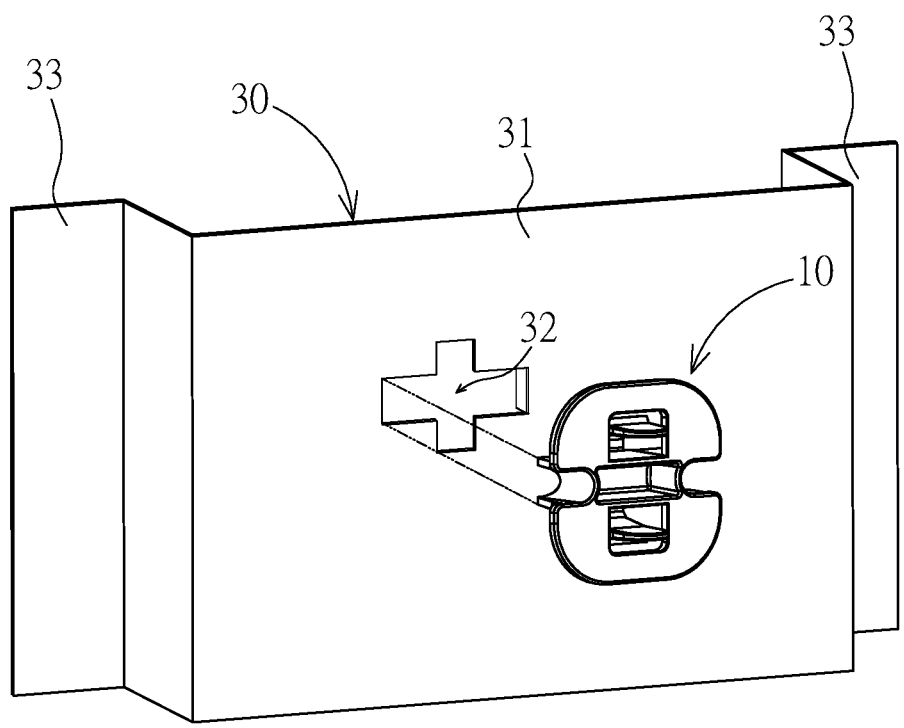
FIG. 4 is a schematic diagram of the cable management device 10 cooperated with a fixing element 30 according to the preferred embodiment of the present invention.

FIG. 4 is a schematic diagram of the cable management device 10 cooperated with a fixing element 30 according to the preferred embodiment of the present invention. Refer to FIG. 4, the cable management device 10 may be cooperated with the fixing element 30 to secure the wire 20. The fixing element 30 may have a resisting plate 31, and an opening 32 may be formed on the resisting plate 31. In this embodiment, the fixing element 30 is cooperated with the cable management device 10. Hence, the fixing element 30 may be but is not limited to a single element. Furthermore, the fixing element 30 may be a portion of an object. For example, the fixing element 30 may be a portion of a case of a computer, a portion of back plate of a desk, or a portion of a wall.

Specifically, the opening 32 on the fixing element 30 may correspond to portions of the cable management device 10. In this embodiment, the opening 32 may have a predetermined pattern so that the wiring body 11, a portion of the first resisting element 12, a portion of the second resisting element 14, the first clipping element 16 and the second clipping element 17 are allowed to pass through the opening 32. As the wiring body 11, the portions of the first and second resisting elements 12 and 14, and the first and second clipping elements 16 and 17 having passed through the opening 32, the resisting plate 31 may contact the first resisting surface 121 and the second resisting surface 141. In this embodiment, a distance D1 from the first assistant resisting part 162 to the first resisting surface 121 (along the normal direction of the first resisting surface 121) may be approximately equal to the thickness of the resisting plate 31. Likewise, a distance from the second assistant resisting part 172 to the second resisting surface 141 (along the normal direction of the second resisting surface 141) may be the same as the distance D1, which may be approximately equal to the thickness of the resisting plate 31.

In the above manner, as having been disposed on the fixing element 30 through the opening 32, the cable management device 10 may clip and thus secure portions of the resisting plate 31 that surround the opening 32, with the help of the first and second resisting surfaces 121 and 141 and the first and second assistant resisting parts 162 and 172.

In operation, when the cable management device 10 is being disposed on the fixing element 30, the first and second penetrating parts 161 and 171 may face toward the opening 32. As the first and second penetrating parts 161 and 171 contact the resisting plate 31, the resisting plate 31 may force the first and second elastic arms 132 and 152 to bend and get close to each other, making a space and thus allowing the first and second clipping elements 16 and 17 to pass through the opening 32. As the first and second clipping elements 16 and 17 have completely passed through the opening 32, the first and second elastic arms 132 and 152 may return to their normal positions respectively. At normal position, the first elastic arm 132 may clip a portion of the resisting plate 31 with the help of the first assistant resisting part 162 and the first resisting surface 121. Likewise, at normal position, the second elastic arm 152 may clip another portion of the resisting plate 31 with the help of the second assistant resisting part 172 and the second resisting surface 141. Thereby, the resisting plate 31 may be secured by the cable management device 10.

On the other hand, if the cable management device 10 is to be removed from the fixing element 30, the first and second releasing parts 133 and 153 may be applied force thereon. Driven by the force, the first and second elastic arms 132 and 152 may bend and get close to each other, making a space and thus allowing the first and second clipping elements 16 and 17 to pass through the opening 32 in an opposite direction. As the first and second clipping elements 16 and 17 have completely passed through the opening 32, the cable management device 10 may be removed from the fixing element 30.

In this embodiment, the fixing element 30 may further include two fixing parts 33, which may respectively extend from two ends of the resisting plate 31. The fixing parts 33 may be connected to a concerned surface by means of gluing, locking and magnetic force.

Figure 5:
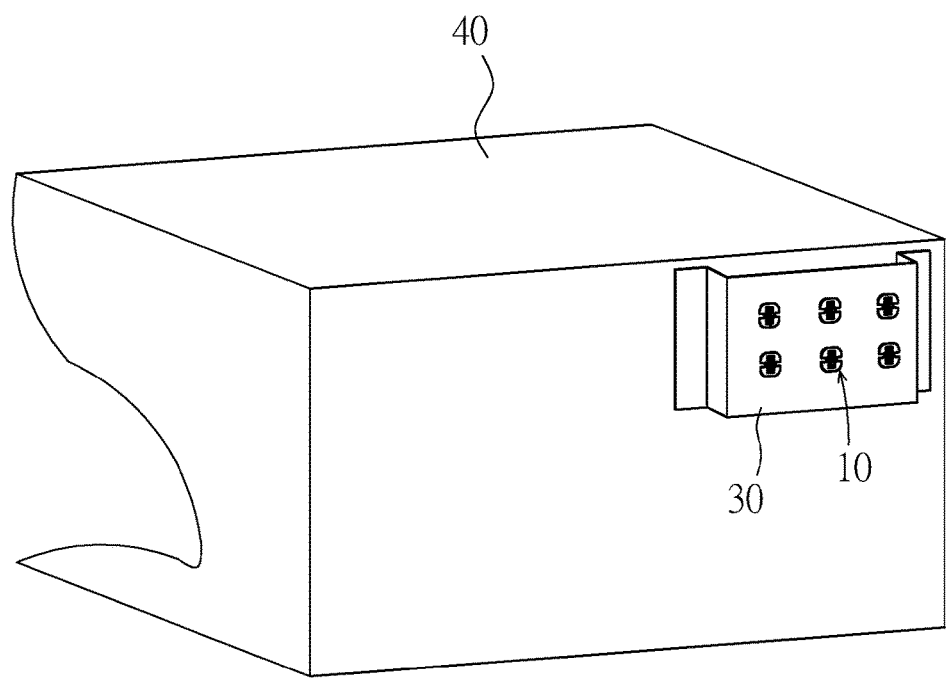
FIG. 5 is a schematic diagram of the cable management device 10 cooperated with the fixing element 30, which are applied to a desk 40, according to a preferred embodiment of the present invention.

FIG. 5 is a schematic diagram of the cable management device 10 cooperated with the fixing element 30, which are applied to a desk 40, according to a preferred embodiment of the present invention. Refer to FIG. 5, a plurality of cable management devices 10 may be disposed on a single fixing element 30 so as to secure and integrate a larger number of wires.

In summary, the cable management device 10 according to the present invention utilizes the groove rail 113 of the wiring body 11 to secure the wire 20. With the cable management device 10 being connected to and thus cooperated with the fixing element 30, the wire 20 can be secured in the groove rail 113, and can be further secured with the help of frictional forces provided by the corners 1133 and 1134. By way of the above, variously sized wires 20 of different diameters can be held tight and thus secured by the cable management device 10 without sliding therein. In addition, with the help of the first and second elastic connecting elements 13 and 15, the cable management device 10 can be easily disposed and removed. Accordingly, the cable management device 10 can be applied to wires of different diameters with additional advantage of easily taking in and down.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A cable management device, being cooperated with a fixing element having a resisting plate with an opening formed thereon, the cable management device comprising:
  a wiring body, having a first sidewall, a second sidewall and a groove rail, the first sidewall being disposed opposite to the second sidewall, the groove rail being formed between the first and second sidewalls and having a input end and a output end at both ends and at least one corner between the input end and the output end;
  a first resisting element, being in the form of a plate and having a first resisting surface, extending from one side of the first sidewall of the wiring body;
  a first elastic connecting element, including a first connecting part and a first elastic arm, a first end of the first connecting part being connected to the wiring body, the first elastic arm being connected to a second end of the first connecting part and extending toward the first resisting element;
  a second resisting element, being in the form of a plate and having a second resisting surface, extending from one side of the second sidewall of the wiring body; and a second elastic connecting element, including a second connecting part and a second elastic arm, a third end of the second connecting part being connected to the wiring body, the second elastic arm being connected to a fourth end of the second connecting part and extending toward the second resisting element;

wherein the wiring body, a portion of the first resisting element and a portion of the second resisting element are adapted to pass through the opening of the fixing element, and wherein the first resisting surface and the second resisting surface are adapted to contact the resisting plate of the fixing element.

2. The cable management device of claim 1, wherein the first elastic arm of the first elastic connecting element passes through a first opening of the first resisting element, and the second elastic arm of the second elastic connecting element passes through a second opening of the second resisting element.

3. The cable management device of claim 2, further comprising:
   a first clipping element, being formed on the first elastic arm between the first connecting part and the first opening; and
   a second clipping element, being formed on the second elastic arm between the second connecting part and the second opening.

4. The cable management device of claim 3, wherein the first clipping element has a first penetrating part and a first assistant resisting part connected to each other, the surface of the first penetrating part has a first slope with respect to the surface of the first elastic arm, the surface of the first assistant resisting part has a second slope with respect to the surface of the first elastic arm, the first slope is smaller than the second slope.

5. The cable management device of claim 4, wherein a distance between the first assistant resisting part and the first resisting surface is equal to a thickness of the fixing element.

6. The cable management device of claim 3, wherein the second clipping element has a second penetrating part and a second assistant resisting part connected to each other, the surface of the second penetrating part has a third slope with respect to the surface of the second elastic arm, the surface of the second assistant resisting part has a fourth slope with respect to the surface of the second elastic arm, the third slope is smaller than the fourth slope.

7. The cable management device of claim 6, wherein a distance between the second assistant resisting part and the second resisting surface is equal to a thickness of the fixing element.

8. The cable management device of claim 2, wherein the first elastic connecting element further includes a first releasing part, being formed on a portion of the first elastic arm that passes through the first opening, the first releasing part has a plurality of first protrusions, and wherein the second elastic connecting element further includes a second releasing part, being formed on a portion of the second elastic arm that passes through the second opening, the second releasing part has a plurality of second protrusions.

9. The cable management device of claim 1, wherein the first resisting surface and the second resisting surface substantially extend along a same plane.

* * * * *